(12) United States Patent
Clevenger et al.

(10) Patent No.: US 11,738,995 B2
(45) Date of Patent: Aug. 29, 2023

(54) MANIPULATION OF A MOLECULE USING DIPOLE MOMENTS

(71) Applicant: International Business Machines Corporation, Armonk, NY (US)

(72) Inventors: Lawrence A. Clevenger, Saratoga Springs, NY (US); Shawn Peter Fetterolf, Cornwall, VT (US); Donald Canaperi, Bridgewater, CT (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 842 days.

(21) Appl. No.: 16/448,264

(22) Filed: Jun. 21, 2019

(65) Prior Publication Data
US 2020/0399122 A1    Dec. 24, 2020

(51) Int. Cl.
| | |
|---|---|
| *B82B 3/00* | (2006.01) |
| *H01L 29/40* | (2006.01) |
| *H01L 29/417* | (2006.01) |
| *H01L 29/08* | (2006.01) |
| *B82Y 40/00* | (2011.01) |

(52) U.S. Cl.
CPC ............ *B82B 3/0076* (2013.01); *H01L 29/08* (2013.01); *H01L 29/408* (2013.01); *H01L 29/417* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 4,390,403 A * | 6/1983 | Batchelder | B01L 3/502784 204/547 |
| 5,795,782 A | 8/1998 | Church et al. | |
| 6,099,803 A | 8/2000 | Ackley et al. | |
| 6,251,595 B1 * | 6/2001 | Gordon | B01J 19/0046 204/400 |
| 7,250,074 B2 | 7/2007 | Tonkovich et al. | |

(Continued)

FOREIGN PATENT DOCUMENTS

| | | | |
|---|---|---|---|
| WO | WO-02072781 A2 * | 9/2002 | ........... A61N 1/0424 |
| WO | 03/099439 A1 | 12/2003 | |
| WO | 2004/050243 A1 | 6/2004 | |

OTHER PUBLICATIONS

Clevenger et al., "Interleaved Structure for Molecular Manipulation"; U.S. Appl. No. 16/429,277, filed Jun. 3, 2019.

(Continued)

*Primary Examiner* — J. Christopher Ball
(74) *Attorney, Agent, or Firm* — Kristofer Haggerty; Cantor Colburn LLP (57) ABSTRACT

A method of manipulating a molecule having a dipole moment is provided. A non-limiting example of the method includes providing an array of electrodes with each respective electrode in electrical communication with a respective interconnect. Each respective electrode is individually addressable through its respective interconnect, and each respective electrode is capable of generating an electromagnetic field when stimulated. The method provides the molecule above the array of electrodes and stimulates one or more electrodes within the array of electrodes to manipulate the molecule.

12 Claims, 11 Drawing Sheets

(56) References Cited

U.S. PATENT DOCUMENTS

| | | |
|---|---|---|
| 7,604,781 B2 | 10/2009 | Brophy et al. |
| 7,704,726 B2 | 4/2010 | Heller et al. |
| 8,183,648 B2 | 5/2012 | Krstic et al. |
| 8,974,652 B2 | 3/2015 | Gascoyne et al. |
| 9,536,721 B2 | 1/2017 | Berdnikov et al. |
| 2002/0036139 A1* | 3/2002 | Becker .............. B01L 3/502792 204/600 |
| 2004/0011651 A1 | 1/2004 | Becker et al. |
| 2004/0058423 A1 | 3/2004 | Albritton et al. |
| 2004/0219523 A1* | 11/2004 | Stanton ................ B82Y 30/00 435/6.14 |
| 2006/0275927 A1* | 12/2006 | Dubin ................ B01J 19/0046 257/157 |
| 2007/0158541 A1* | 7/2007 | Katori ................ H01L 29/7888 257/E29.301 |
| 2008/0187915 A1 | 8/2008 | Polonsky et al. |
| 2008/0203502 A1 | 8/2008 | Heller et al. |
| 2011/0242374 A1* | 10/2011 | Massetti ........... H01L 27/14621 348/280 |
| 2015/0001084 A1 | 1/2015 | Peter et al. |
| 2016/0067706 A1 | 3/2016 | Molho et al. |
| 2016/0199853 A1 | 7/2016 | Harwood et al. |
| 2017/0326558 A1 | 11/2017 | Mahshid et al. |
| 2018/0037456 A1 | 2/2018 | Drexler |
| 2019/0371655 A1 | 12/2019 | Hsiao et al. |
| 2020/0105603 A1 | 4/2020 | Chang et al. |
| 2020/0105870 A1 | 4/2020 | Ching et al. |
| 2020/0259014 A1 | 8/2020 | Ching et al. |

OTHER PUBLICATIONS

Davis et al.; "Simulations for guiding the delivery and trapping of single biomolecules in a nanofluidic device"; SPIEDigitalLibrary.org/conference-proceedings-of-spie (2010); 10 pages.

Leanhardt et al.; "High-Resolution Spectroscopy on Trapped Molecular Ions in Rotating Electric Fields: A New Approach for Measuring the Electron Electric Dipole Moment"; University of Colorado, Boulder- Physics Faculty Contributions (2011); 41 pages.

List of IBM Patents or Patent Applications Treated as Related; Date Filed: Jun. 21, 2019, 2 pages.

Niitsu et al.; "Development of Microelectrode Arrays Using Electroless Plating for CMOS-Based Direct Counting of Bacterial and HeLa Cells"; IEEE Transactions on Biomedical Circuits and Systems, vol. 9, No. 5; Oct. 2015; 13 pages.

Yousuff et al.; "Microfluidic Platform for Cell Isolation and Manipulation Based on Cell Properties"; MDPI-micromachines, www.mdpi.com/journal/micromachines; Jan. 4, 2017; 26 pages.

* cited by examiner

MANIPULATION OF A MOLECULE USING DIPOLE MOMENTS

BACKGROUND

The present invention generally relates to semiconductor structures and more specifically, to manipulation of a molecule using dipole moments Semiconductor fabrication techniques present the opportunity to control the placement and orientation of molecules using dipole moments. This is being performed at the molecular scale. Molecular control is useful in supporting a variety of applications, such as molecular separation, fabrication and specific dosing for medical uses.

SUMMARY

Embodiments of the present invention are directed to a method of operating a semiconductor structure for manipulating a molecule having a dipole moment. A non-limiting example of the method includes providing an array of electrodes with each respective electrode in electrical communication with a respective interconnect. Each respective electrode is individually addressable through its respective interconnect, and each respective electrode is capable of generating an electromagnetic field when stimulated. The method provides the molecule above the array of electrodes and stimulates one or more electrodes within the array of electrodes to manipulate the molecule.

Embodiments of the present invention are also directed to a semiconductor structure. A non-limiting example of the structure includes a substrate having a plurality of interconnects. The structure also includes an array of electrodes with each respective electrode in electrical communication with a respective interconnect. Each respective electrode is individually addressable through its respective interconnect, and each respective electrode is capable of generating an electromagnetic field when stimulated.

Embodiments of the present invention are also directed to a method of operating a semiconductor structure for manipulating a molecule having a dipole moment. A non-limiting example of the method includes providing an array of electrodes with each respective electrode in electrical communication with a respective interconnect. Each respective electrode is individually addressable through its respective interconnect, and each respective electrode is capable of generating an electromagnetic field when stimulated. The method provides the molecule above the array of electrodes and provides an electric field from one or more of the array of electrodes to manipulate the molecule.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

There is a rising need for the manipulation of molecules in order to separate molecules, produce new molecules, split molecules, or splice molecules together. This can be done through taking advantage of the dipole moments within molecules. Prior systems attempted to manipulate molecules used chemical or biological agents to perform manipulation. Other systems use electrophoretic agents to grossly aggregate polarized or otherwise electrically charged molecules. But these systems do not operate on fine grained manipulation of molecules, but rather on aggregations of molecules.

Turning now to an overview of the aspects of the invention, one or more embodiments of the invention address the above-described shortcomings of the prior art by providing a structure that exploits the dipole within a molecule. Dipole moments occur when there is a separation of charge. They can occur between two ions in an ionic bond or between atoms in a covalent bond; dipole moments arise from differences in electronegativity. Embodiments of the present invention provide for field generation at a plurality of surface-based structures that permits that movement of a molecule by using the dipole of the molecule. Molecules can be translated, rotated, split, or spliced. The ability to precisely manufacture extremely small features given modern nano-fabrication techniques makes this possible with dimensions ranging from several micrometers to tens of nanometers.

The above-described aspects of the invention address the shortcomings of the prior art by providing a precisely manufactured nano-scale 2D structure that provides surface-based electro kinetic-control of individual molecules using the dipoles inherent in the subject material. The molecule can be moved translationally or rotated about an axis. Further, the described embodiments of the invention provide control of the use of the described semiconductor structure using applied electric fields to manipulate the subject material along the surface.

Embodiments of the invention provide an array of individually addressable electrodes, each capable of producing an electromagnetic field when stimulated. Each electrode is formed in an appropriately dense matrix given the materials to be manipulated. Each electrode is isolated from its neighbors as appropriate. In addition to moving the molecule, the array of electrodes can also be used to hold a molecule in place for splicing together with a second molecule or dicing the molecule.

The control architecture is such that all electrodes can be controlled in unison or in any given subset of electrodes. Subsets can be selected based upon molecular moment dipoles of the substance being manipulated.

These 2D structure electrodes are used in combination to create a field to attract a molecule based upon the macro-molecular dipole of the molecule. This can be used for example with, for example, deoxyadenosine triphosphate to manipulate the molecule. The molecule can be held in placed or moved about the surface of the semiconductor structure.

When the described aspects of embodiments of the invention are put into use, the embodiments facilitate application of a field selectively to portions of a molecule that will orient and/or move the molecule in a channel. Individual electrodes in embodiments of the invention are controlled individually and intelligently. This is accomplished through the use of a plurality of 2D electrodes in the semiconductor structure of embodiments of the invention.

Figure 1:
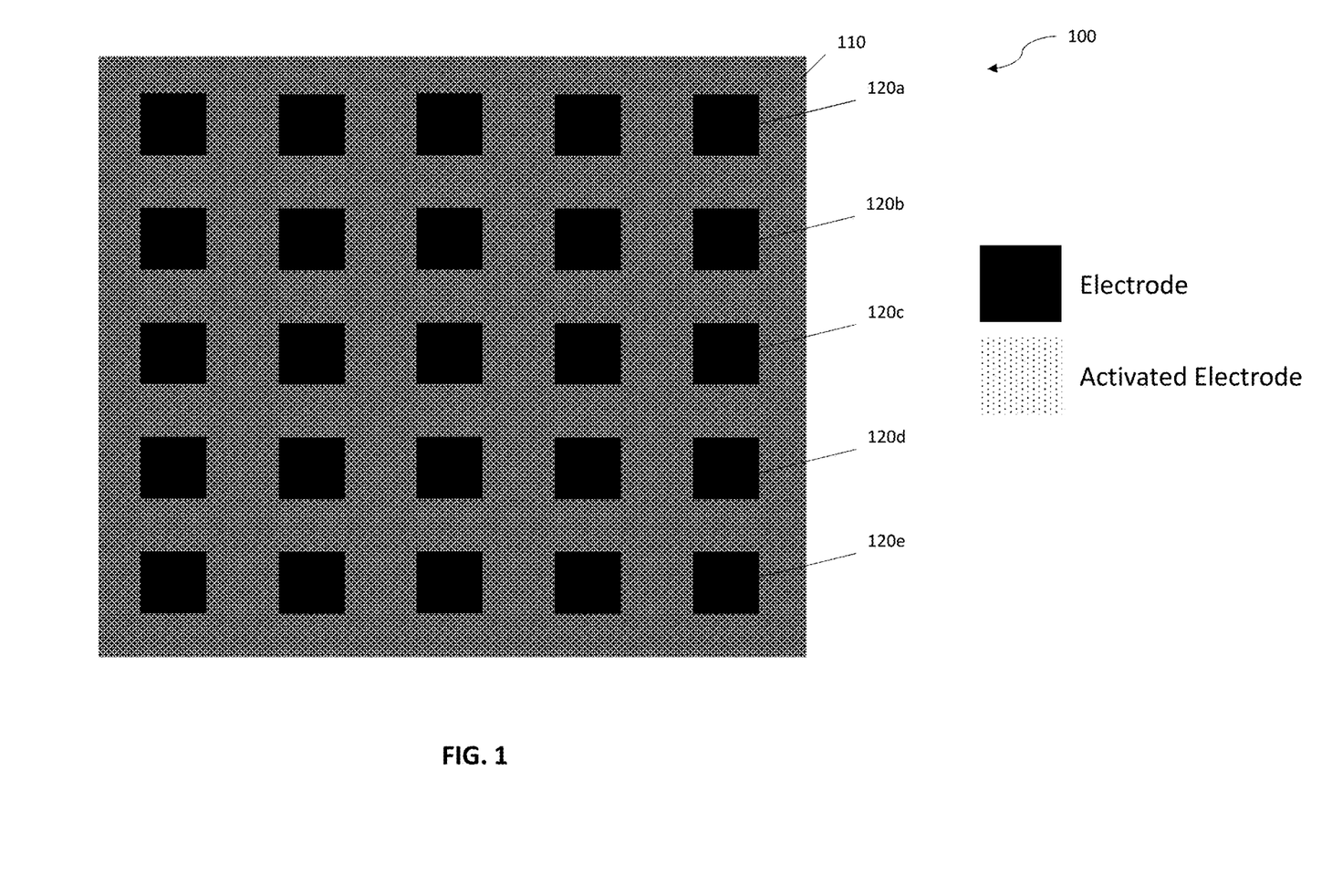
FIG. 1 depicts a top down view of an electrode array according to embodiments of the invention.

Turning now to a more detailed description of aspects of the present invention, FIG. 1 depicts a top down view of an electrode array 100 according to embodiments of the invention. A substrate 110 including, for example, a ceramic, a polymer, a plastic, or a silicon wafer has embedded therein a plurality of electrodes 120*a*, 120*b*, 120*c*, 120*d*, and 120*e* (collectively, electrodes 120). The electrodes 120 include, for example, tungsten, cobalt, aluminum, copper, gold, silver, nickel, doped silicon, germanium, or a silicide. The electrodes 120 are individually addressable and are each capable of producing an electromagnetic field when stimulated. Each electrode 120 is formed in an appropriately dense matrix given the materials to be manipulated. Each electrode 120 is isolated from its neighboring electrode as appropriate. Although a five by five matrix is illustrated, in practice the size of the matrix can be considerably larger. While an orthogonal grid is illustrated, the electrodes 120 are not necessarily arranged in a strictly grid-like pattern, but those skilled in the art will appreciate after reading this description that the electrodes 120 can be arranged in other configurations.

Figure 2:
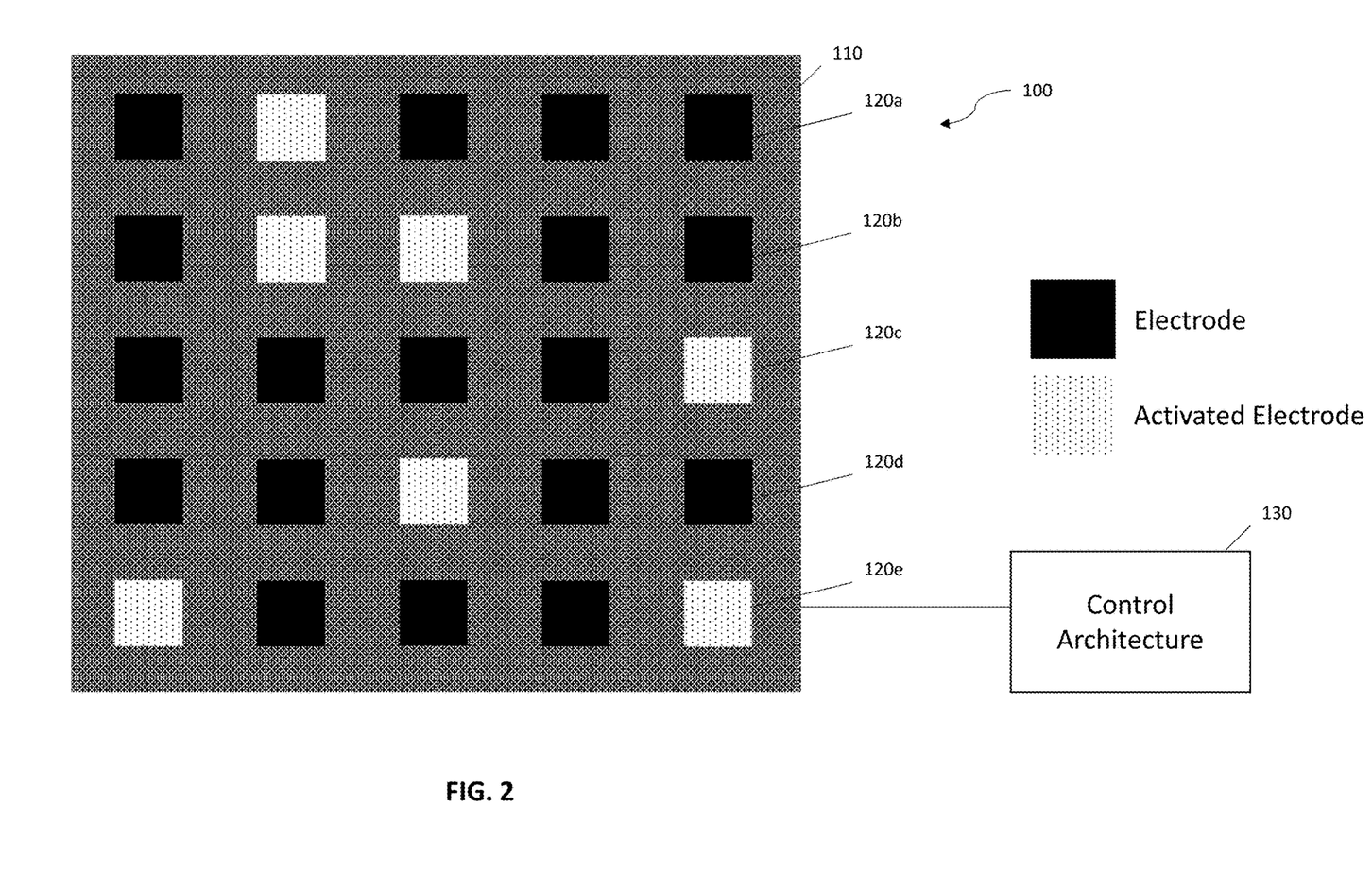
FIG. 2 depicts a top down view of the electrode array according to embodiments of the invention.

FIG. 2 depicts a top down view of the electrode array 100 according to embodiments of the invention. A control architecture 130 for controlling electrodes 120 is such that all electrodes 120 can be controlled in unison, or any given subset of electrodes 120 can be controlled based upon molecular moment dipoles of a manipulated substance in question. The control architecture 130 includes, for example, a set of logic gates. In addition, as previously stated, each electrode 120 can be individually controlled to manipulate the substance. Each electrode 120 can be controlled individually to enable field generation at the appropriate micro-molecular dipole locations as well as macro-molecular dipole locations of the manipulated substance. FIG. 2 illustrates some electrodes in an activated state.

Figure 3:
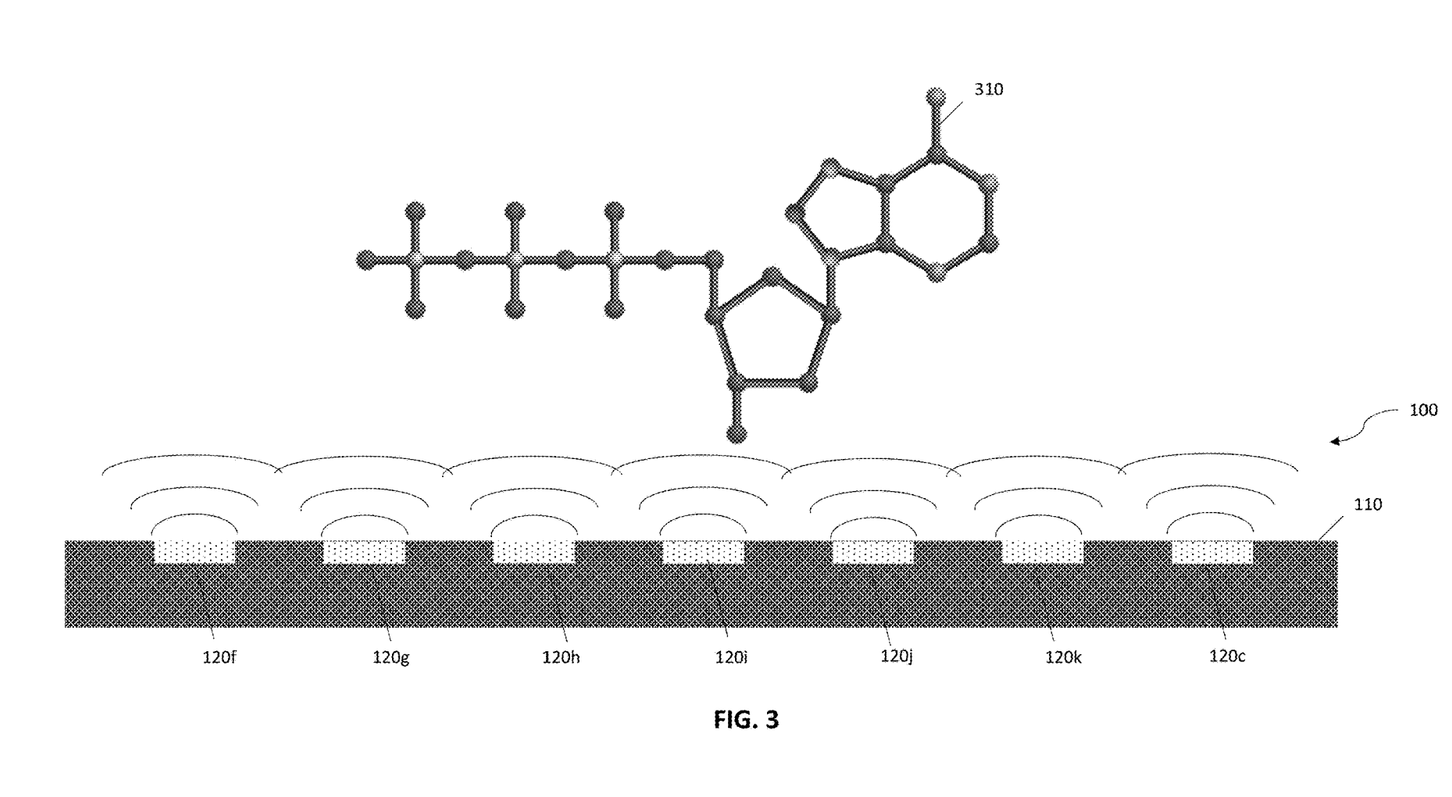
FIG. 3 depicts a side view of the electrode array manipulating a molecule, deoxyadenosine triphosphate, according to embodiments of the invention.
Figure 4:
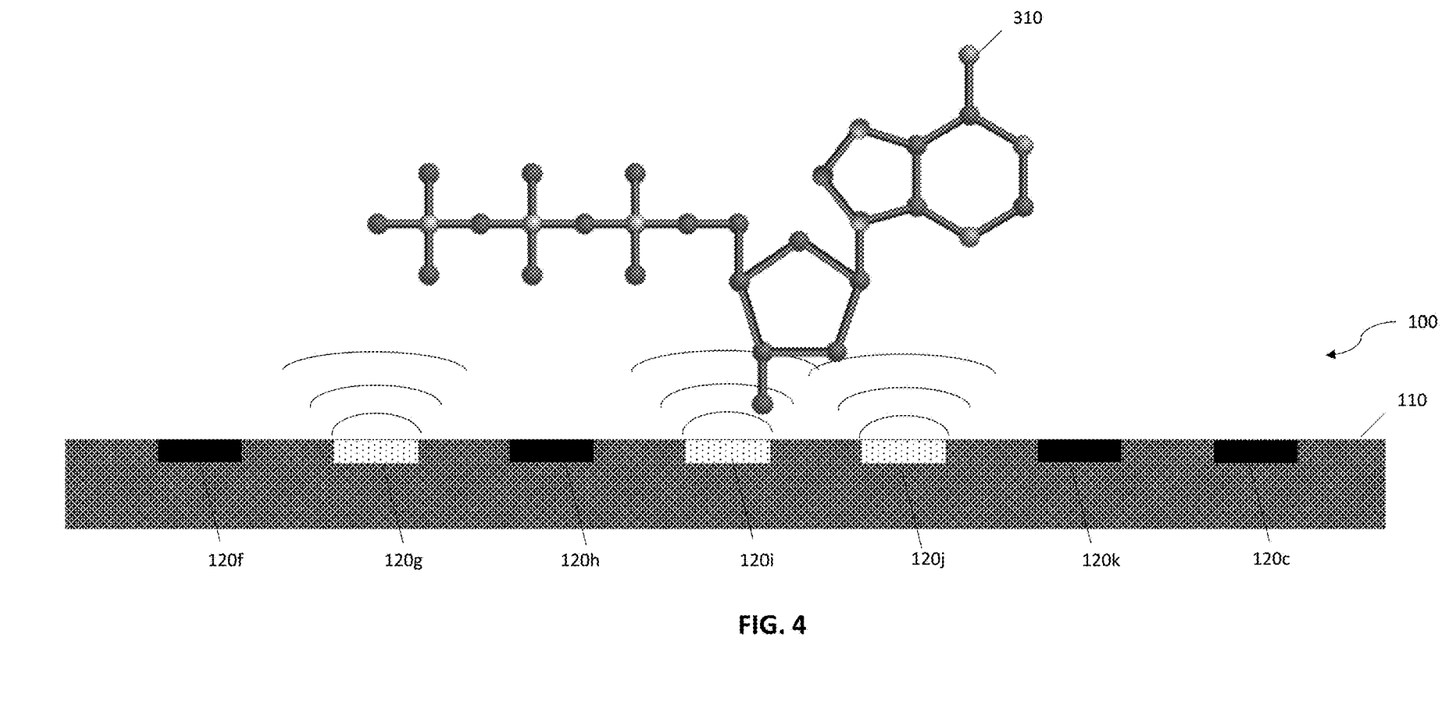
FIG. 4 depicts a side view of the electrode array manipulating a molecule, deoxyadenosine triphosphate, according to embodiments of the invention.

FIG. 3 depicts a side view of the electrode array 100 manipulating a molecule, deoxyadenosine triphosphate 310, according to embodiments of the invention. The molecule 310 is manipulated by activating electrodes 120*c*, *f-k* in combination to create a field to attract the molecule based upon the macro-molecular dipole of the molecule 310. FIG. 4 depicts a side view of the electrode array 100 manipulating the molecule, deoxyadenosine triphosphate 310, according to embodiments of the invention. The molecule 310 is manipulated by activating electrodes 120*g*, 120*i*, and 120*j* in combination to create a field to attract the molecule based upon the micro-molecular dipole of the molecule 310.

Figure 5:
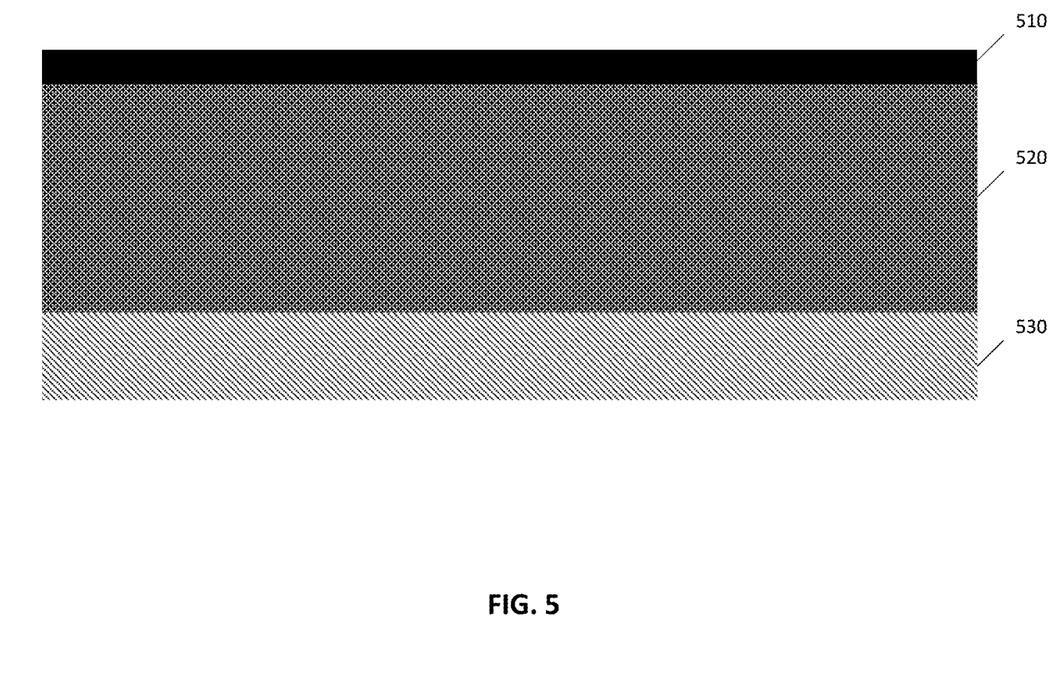
FIG. 5 depicts a cross-sectional view of a semiconductor structure after a processing operation according to one or more embodiments of the present invention.

FIGS. 5-11 depict one method for the formation of the electrode array 100. FIG. 5 depicts a cross-sectional view of a semiconductor structure after a processing operation according to one or more embodiments of the present invention. A substrate 530 is provided with an underlying wiring layer (not shown). The substrate 530 typically includes copper interconnects (not shown) used to interface with the eventually formed electrodes. The interconnects (not shown) can be tungsten or some other material, rather than copper.

A dielectric layer 520 is deposited upon the substrate 530. The dielectric layer 520 is deposited by, for example, chemical vapor deposition. The dielectric layer 520 includes, for example silicon dioxide or carbon-bearing dielectrics with dielectric constants that are less than about 3. A hardmask layer or layers 510 is deposited by, for example, chemical vapor deposition, for patterning. The hardmask layer or layers 510 can be, for example, silicon nitride or a metal nitride.

Figure 6:
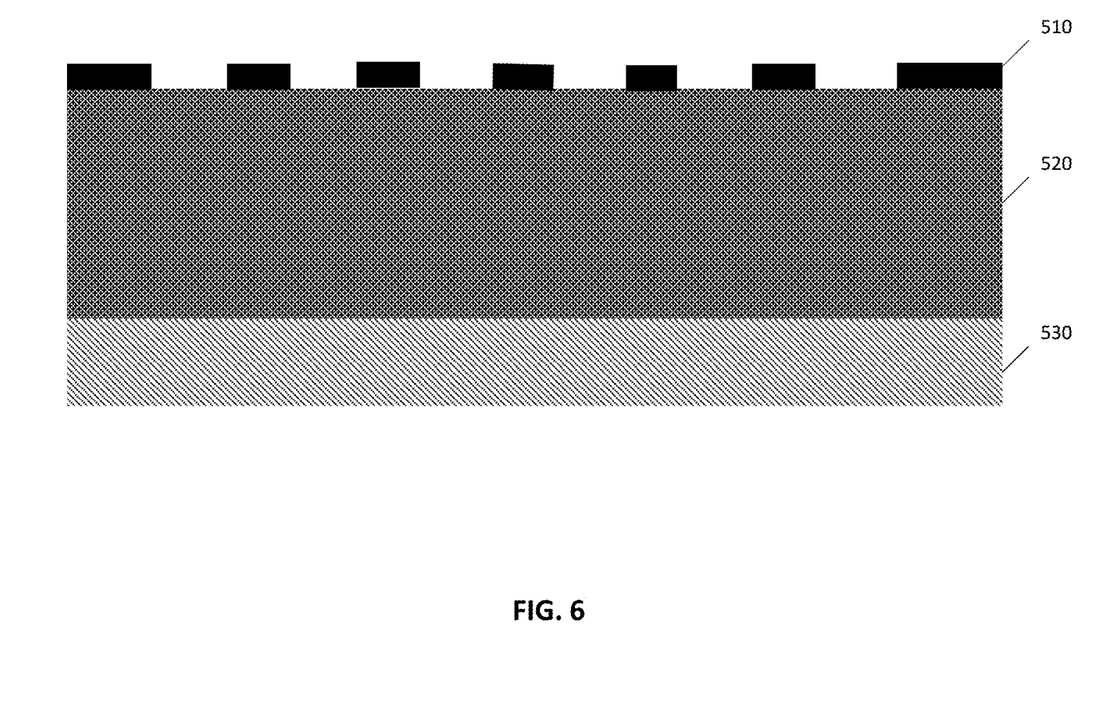
FIG. 6 depicts a cross-sectional view of a semiconductor structure after a processing operation according to one or more embodiments of the present invention.

FIG. 6 depicts a cross-sectional view of a semiconductor structure after a processing operation according to one or more embodiments of the present invention. The hardmask layer or layers 510 undergoes lithography and resistive ion etching ("RIE") to pattern the hardmask layer 510.

Figure 7:
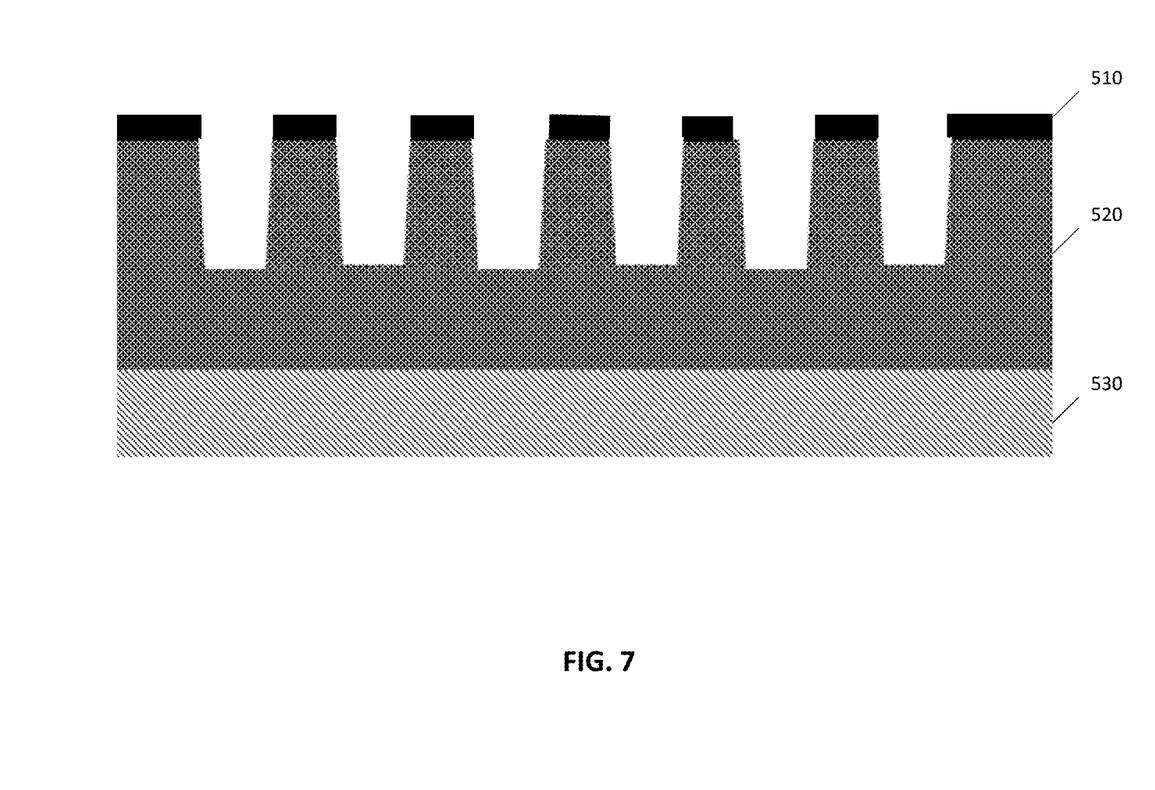
FIG. 7 depicts a cross-sectional view of a semiconductor structure after a processing operation according to one or more embodiments of the present invention.

FIG. 7 depicts a cross-sectional view of a semiconductor structure after a processing operation according to one or more embodiments of the present invention. Following the patterning of the hardmask layer 510, RIE is performed to etch trenches for the electrodes.

Figure 8:
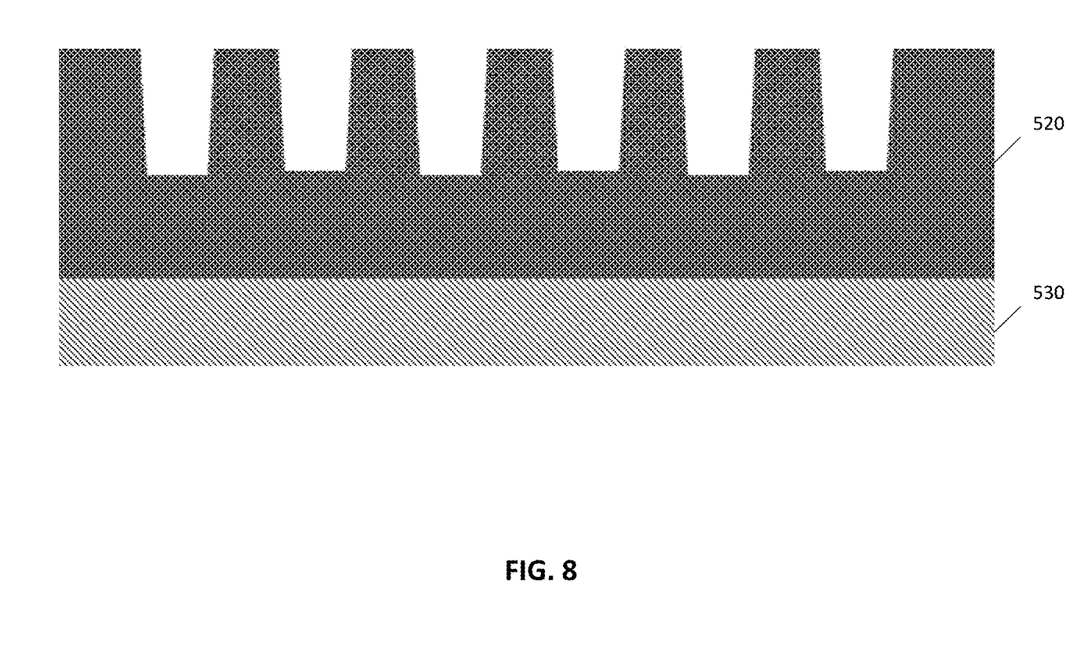
FIG. 8 depicts a cross-sectional view of a semiconductor structure after a processing operation according to one or more embodiments of the present invention.

FIG. 8 depicts a cross-sectional view of a semiconductor structure after a processing operation according to one or more embodiments of the present invention. The hardmask layer or layers 510 is removed through RIE or etching.

Figure 9:
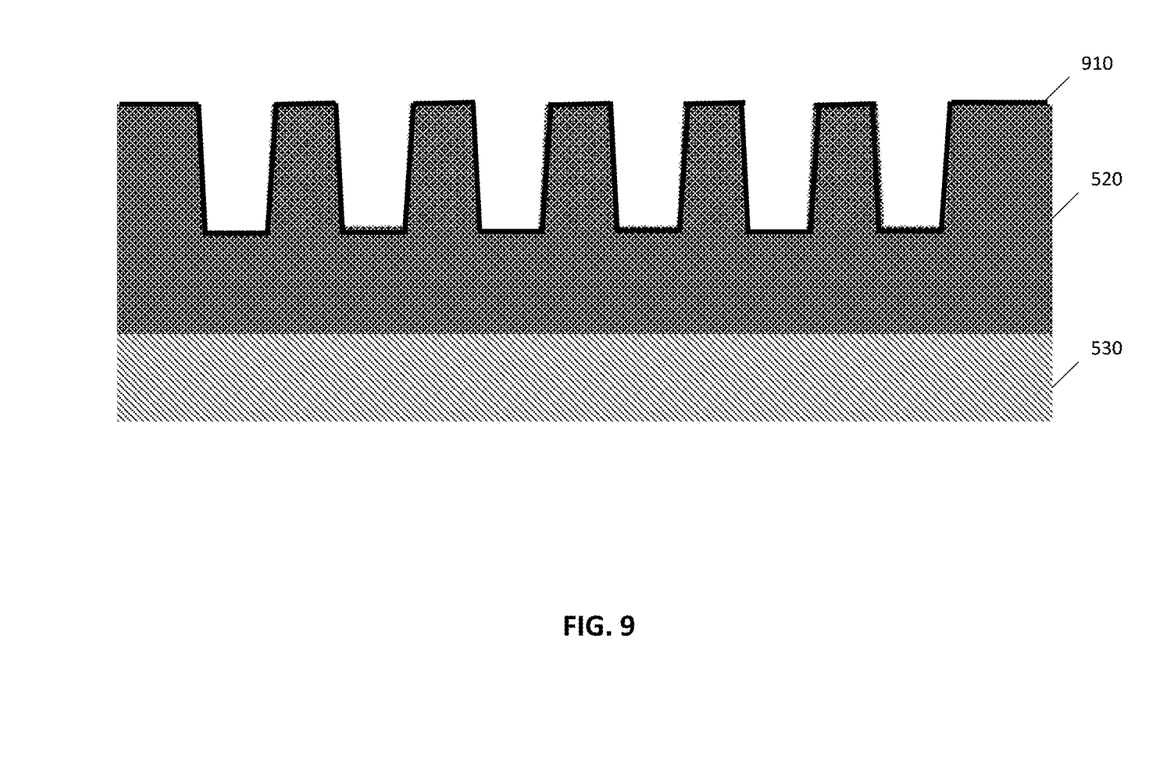
FIG. 9 depicts a cross-sectional view of a semiconductor structure after a processing operation according to one or more embodiments of the present invention.

FIG. 9 depicts a cross-sectional view of a semiconductor structure after a processing operation according to one or more embodiments of the present invention. A liner layer or layers 910 is deposited. The liner layer 9 or layers 10 includes, for example, tantalum or tantalum nitride and is deposited by, for example, physical vapor deposition, although materials amenable to chemical vapor deposition can also be used.

Figure 10:
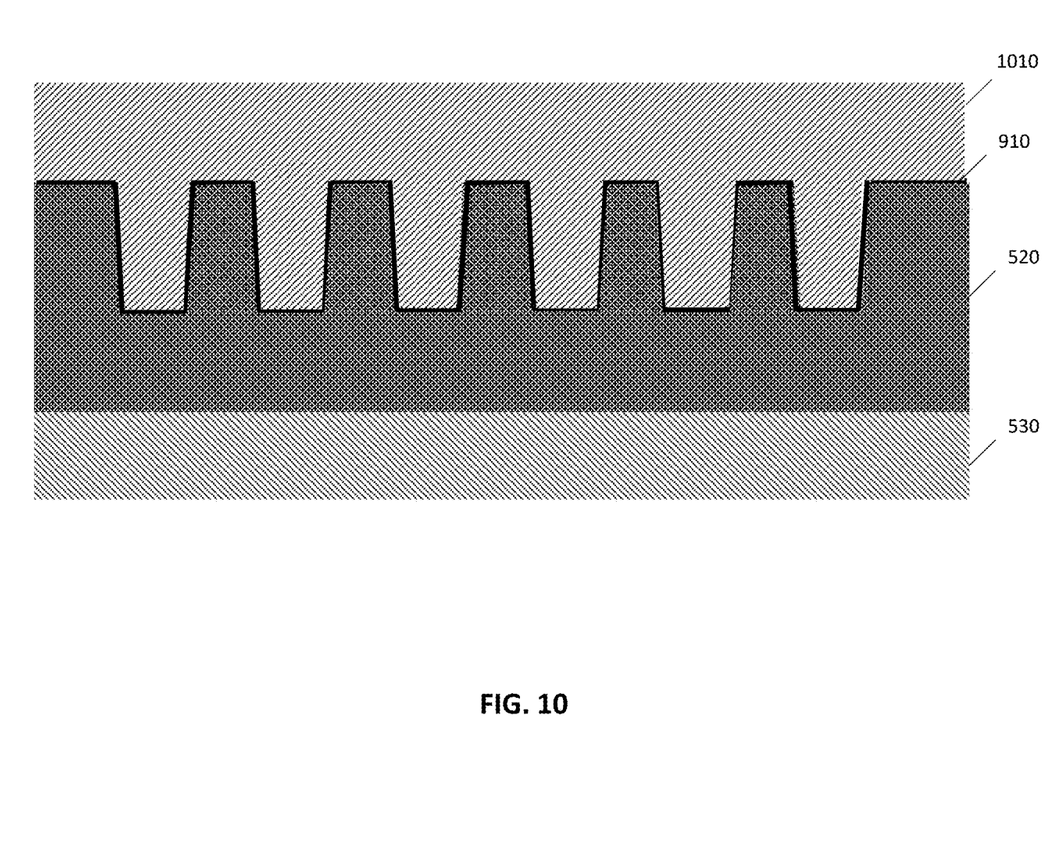
FIG. 10 depicts a cross-sectional view of a semiconductor structure after a processing operation according to one or more embodiments of the present invention.

FIG. 10 depicts a cross-sectional view of a semiconductor structure after a processing operation according to one or more embodiments of the present invention. A metal 1010 is deposited for forming the electrodes. Composition of the metal layer 1010 can be, for example, tungsten, cobalt, aluminum, copper, gold, silver, nickel, doped silicon, germanium, or a silicide. The metal layer 1010 can also comprise a platinum group metal such as ruthenium. The metal layer 1010 is deposited by electroplating or chemical vapor deposition, for example.

Figure 11:
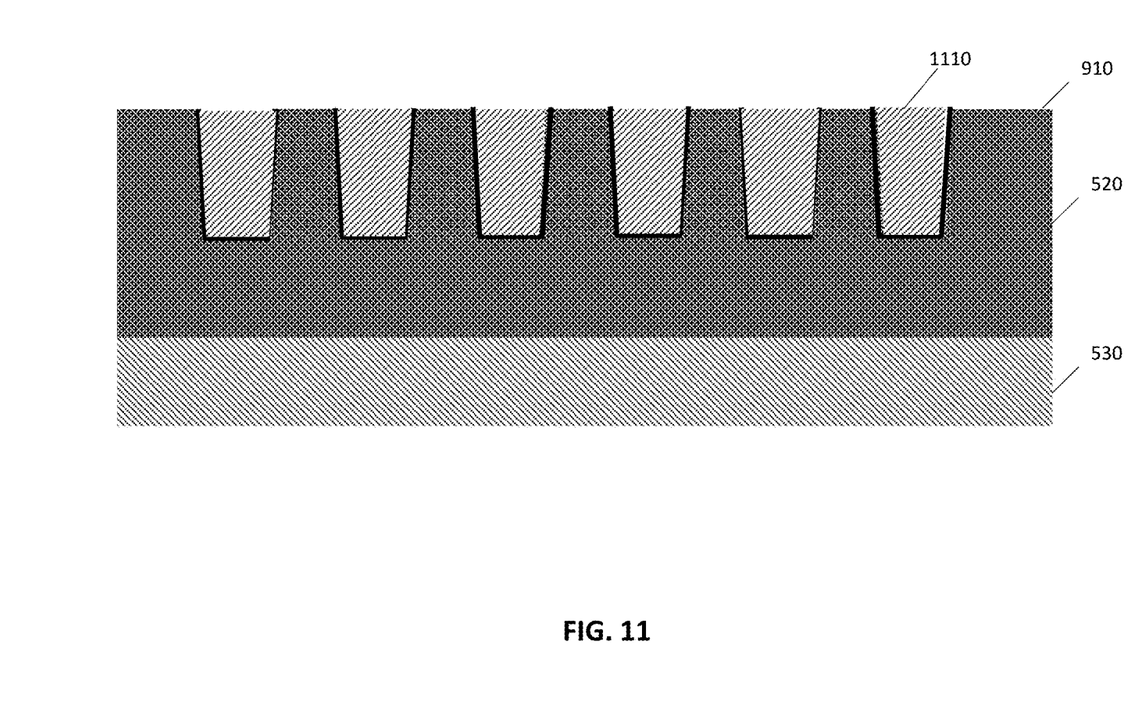
FIG. 11 depicts a cross-sectional view of a semiconductor structure after a processing operation according to one or more embodiments of the present invention.

FIG. 11 depicts a cross-sectional view of a semiconductor structure after a processing operation according to one or more embodiments of the present invention. The metal 1010 undergoes chemical-mechanical planarization to create the final electrodes 1110 of the electrode array 100.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

As previously noted herein, for the sake of brevity, conventional techniques related to semiconductor device and integrated circuit (IC) fabrication may or may not be described in detail herein. For example, an alternative "subtractive metal etch" process flow for fabrication of this device could be used. In this sequence, a blanket metal film is deposited in the initial substrate. Lithography and RIE process are then used to pattern the metal film. A dielectric material is then deposited to fill the resulting trenches and CMP is used to remove the excess (overburden) of dielectric to form the electrode structure. In any process flow for fabrication of the electrodes, there may be subsequent deposition or treatment steps to modify the electrode surface to improve the function of molecular manipulation. These additional steps may be, but are not limited to selective deposition of additional layers or material modifications though anneals or reactive processes such as nitridation or silicidation. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, ALD among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage.

By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of operating a semiconductor structure for manipulating a molecule having a dipole moment, the method comprising:
providing an array of electrodes with each respective electrode in electrical communication with a respective interconnect, wherein each respective electrode is individually addressable through its respective interconnect and each respective electrode is capable of generating an electromagnetic field when stimulated;
providing the molecule above the array of electrodes;
selecting a subset of electrodes of the array of electrodes based upon a location of the dipole moment of the molecule; and
stimulating the selected subset of electrodes within the array of electrodes to individually manipulate the molecule, wherein each electrode of the selected subset of electrodes is configured to provide a field generation at a micro-molecular dipole location and a macro-molecular dipole location of the molecule, wherein manipulating the molecule comprises rotating the molecule within the array of electrodes.

2. The method of claim 1, wherein stimulating the selected subset of electrodes within the array of electrodes to manipulate the molecule comprises stimulating all of the electrodes within the array of electrodes to attract the molecule to the array of electrodes.

3. The method of claim 1, wherein manipulating the molecule comprises moving the molecule within the array of electrodes.

4. The method of claim 1, wherein manipulating the molecule comprises dicing the molecule into a second and third molecule.

5. The method of claim 1, wherein manipulating the molecule comprises splicing the molecule with a second molecule.

6. The method of claim 1, wherein manipulating the molecule comprises separating the molecule from a second molecule.

7. A method of operating a semiconductor structure for manipulating a molecule having a dipole moment, the method comprising:
providing an array of electrodes with each respective electrode in electrical communication with a respective interconnect, wherein each respective electrode is individually addressable through its respective interconnect and each respective electrode is capable of generating an electromagnetic field when stimulated;
providing the molecule above the array of electrodes;
selecting a subset of electrodes of the array of electrodes based upon a location of the dipole moment of the molecule; and
providing an electric field using the selected subset of electrodes of the array of electrodes to individually manipulate the molecule, wherein each electrode of the selected subset of electrodes is configured to provide a field generation at a micro-molecular dipole location and a macro-molecular dipole location of the molecule, wherein manipulating the molecule comprises dicing the molecule into a second and third molecule.

8. The method of claim 7, wherein providing an electric field comprises stimulating all of the electrodes within the array of electrodes to attract the molecule to the array of electrodes.

9. The method of claim 7, wherein manipulating the molecule comprises moving the molecule within the array of electrodes.

10. The method of claim 7, wherein manipulating the molecule comprises rotating the molecule within the array of electrodes.

11. The method of claim 7, wherein manipulating the molecule comprises splicing the molecule with a second molecule.

12. A method of operating a semiconductor structure for manipulating a molecule having a dipole moment, the method comprising:
providing an array of electrodes with each respective electrode in electrical communication with a respective interconnect, wherein each respective electrode is individually addressable through its respective interconnect and each respective electrode is capable of generating an electromagnetic field when stimulated;
providing the molecule above the array of electrodes;
selecting a subset of electrodes of the array of electrodes based upon a location of the dipole moment of the molecule; and
stimulating the selected subset of electrodes within the array of electrodes to individually manipulate the molecule, wherein each electrode of the selected subset of electrodes is configured to provide a field generation at a micro-molecular dipole location and a macro-molecular dipole location of the molecule, wherein manipulating the molecule comprises dicing the molecule into a second and third molecule.

\* \* \* \* \*